United States Patent [19]
Haskell

[11] Patent Number: 4,729,001
[45] Date of Patent: Mar. 1, 1988

[54] SHORT-CHANNEL FIELD EFFECT TRANSISTOR

[75] Inventor: Jacob D. Haskell, Palo Alto, Calif.

[73] Assignee: Xerox Corporation, Stamford, Conn.

[21] Appl. No.: 555,248

[22] Filed: Nov. 25, 1983

Related U.S. Application Data

[63] Continuation of Ser. No. 286,927, Jul. 27, 1981, abandoned.

[51] Int. Cl.$^4$ .................. H01L 29/78; H01L 29/08
[52] U.S. Cl. ..................... 357/23.3; 357/23.4; 357/20
[58] Field of Search .............. 357/23 SC, 23 UD, 20

[56] References Cited
U.S. PATENT DOCUMENTS 4,334,235 6/1982 Nishizawa .................. 357/55

OTHER PUBLICATIONS

Shannon et al. "MOS Frequency Soars with Ion Implanted Layers" Electronics, 2-3-69, pp. 97-100.

Primary Examiner—Andrew J. James
Assistant Examiner—John Lamont
Attorney, Agent, or Firm—Serge Abend

[57] ABSTRACT

An improved short-channel field effect transistor including a standard tip implant type of source and drain each disposed in the surface of a semiconductor substrate and a gate electrode positioned upon the substrate between the source and drain and control plugs disposed in the substrate and associated with and contiguous to the source and drain for eliminating substrate punch-through currents without substantially increasing the device junction capacitance.

5 Claims, 8 Drawing Figures

SHORT-CHANNEL FIELD EFFECT TRANSISTOR

This is a continuation of application Ser. No. 286,927, filed July 27, 1981 and now abandoned.

This invention relates to an improved short channel field effect transistor having a control plug positioned between the source and drain regions for eliminating the deleterious effects of substrate punch-through currents, without excessive junction capacitance.

The desire to achieve very large scale integrated (VLSI) circuits including upwards of 100,000 metal oxide semiconductor field effect transistors (MOSFET) and other logic devices on a single small silicon area ("chip") has led to an unrelenting search for approaches to diminish device size. As improvements are made, it will be possible to fabricate larger, self-contained, electronic systems on a chip which will have greater electronic switching capacity, will cost less per function, will be capable of performing more and more complex functions, will use less power and will be able to perform these functions in a shorter time. It had been thought at one time that it would only be necessary to proportionally reduce all the device dimensions and voltage levels and to appropriately modify doping levels. Initially, this approach was satisfactory. However, as will become apparent, the mere scaling down of all the elemental dimensions of the device, in and of itself, quickly leads to problems which detract from the performance of the logic devices and may even prevent their operation.

In the conventional MOSFET device illustrated in FIG. 1 there is provided a monocrystalline, or lightly doped, semiconductor supporting substrate, of high bulk resistivity, of either the p or n conductivity type. Two, spaced, heavily doped, low resistivity regions (source and drain) of the conductivity type opposite to the substrate bulk are formed within the substrate by selective diffusion of appropriate dopants. Typically, the distance separating these two diffused regions is on the order of 1 $\mu$m. A thin conductive layer (the gate), of polysilicon or suitable metal, such as aluminum, overlies the area between the source and drain regions but is electrically insulated from them and the substrate by a thin dielectric layer of silicon dioxide. When a dielectric material other than silicon dioxide is used, the device may be termed a MISFET. Throughout this document, whenever the term MOSFET is used, it is contemplated that the term MISFET shall be equivalent, unless stated otherwise. The single device is connected to other devices in the circuit by ohmic contacts, usually of metal, connected to the low resistivity source and drain regions. It is made operative by connecting appropriate potential sources to the source, gate and drain, relative to the substrate.

The gate serves as the control element of the device. No transverse current will flow through the structure between the source and the drain junctions when the gate voltage is below threshold. However, optimally, when the desired gate-to-source switching voltage (gate threshold voltage) is applied to the gate, an inversion layer of opposite conductivity type will be induced in the substrate directly below the gate, providing a conductive path or channel, between the source and drain regions (as represented by crosshatching in FIG. 2 and the subsequent drawings, for ease of identification). This normally "OFF" type of operation, wherein the current surface channel is formed by application of a voltage to the gate, is referred to as the "enhancement" mode.

When the device is normally "ON" and comprises a conducting channel through the substrate between the source and drain regions at zero gate voltage, and application of a gate-to-source voltage of appropriate magnitude and polarity decreases the concentration of charge carriers in the channel to pinch-off current flow, the type of operation is referred to as the "depletion" mode.

The beneficial results attainable by decreasing the device size through a shorter channel length between source nd drain have been accompanied by problems. A major performance limitation encountered, as the channel length is decreased, is punch-through. This phenomenon subverts the beneficial operation of the device by substantially decreasing, and in some cases eliminating, the control function performed by the gate. Punch-through occurs as a depletion region widens around the drain, in all directions, under the influence of the increasing drain voltages (as represented by the family of phantom lines in FIG. 2), into the relatively lightly doped substrate bulk. When the drain voltage is sufficiently high, the growing drain depletion region overlaps with the depletion region around the source (as shown by the dotted lines in FIG. 2) and charge carriers can be injected from the source into the drain depletion region where they are then swept by the electric field over to the drain.

In order to diminish depletion regions and minimize punch-through in short channel devices, the channel substrate region conductivity is increased. However, while decreasing the depletion region, the heavy doping (which extends to the junction depths) also increases the junction capacitance, thus slowing down the switching speed of the device. Thus, good device design usually dictates the proper balancing of doping levels and locations to minimize the depletion region and the junction capacitance while allowing a minimum length for the channel.

Another known approach to diminish the deleterious effect of the depletion region is illustrated in FIG. 3 wherein the source and drain regions are formed as extremely shallow diffusions within the substrate. By so doing, while the depletion region will grow as just described, the growth will extend primarily beneath the source and drain junctions into the substrate bulk and not between these junctions. Punch-through will not take place. This device construction, while succeeding in its primary purpose causes another problem to arise, namely, it is difficult to make a good ohmic contact with the extremely shallow junctions without the occurrence of a spike or short circuit directly from the electrode to the substrate.

A prior art approach which has been generally successful in diminishing the punchthrough and junction capacitance is shown in FIG. 4 and is disclosed in U.S. Pat. No. 4,011,576. The MOSFET device shown is configured with source and drain junctions each formed with a heavily doped shallow diffusion portion (the tip), between which there is a relatively short channel, and a lightly doped deep diffusion portion. The spacing between the deep diffusion portions is made large enough so that even as the depletion region may become large, punch-through will be avoided. Similarly, the MISFET taught in U.S. Pat. No. 4,080,618 includes a tip implant structure which allows the channel beneath the gate to be short while simultaneously allowing the deep diffusion portions to be moved apart from one another to help eliminate depletion region punch-through. It has been found, however, that this design approach will also find its limit as the channel is made shorter and the device is made smaller.

The known constructions described above have required a delicate balance between junction spacings and doping levels in order to prevent punch-through and to minimize junction capacitance. However, as device dimensions are continuously made smaller, the problems are exacerbated and balancing is not entirely successful.

Therefore, the instant invention is directed to an improved short channel field effect transistor uniquely designed to enable an even shorter channel between source and drain and to provide a solution which eliminates the need to balance the critical device parameters, as heretofore required, while achieving the desired results in a novel manner. By the introduction of another diffusion in the form of a higher doped plug or stopper, of the same conductivity type as the substrate, beneath the shallow diffusions, or tips, and contiguous to the front face of the deep diffusions, a shield is provided against the flow of current from the source to the drain, in the deep diffusion area where punch-through is likely to occur.

A more complete understanding of the present invention and its advantages may be obtained by reference to the following description taken in conjunction with the accompanying drawings in which.

The prior art devices shown in FIGS. 1 through 4 of the drawings have been generally described in the background portion of this disclosure. The novel device of the present invention will now be described with reference to FIGS. 5 through 7.

Figure 1:
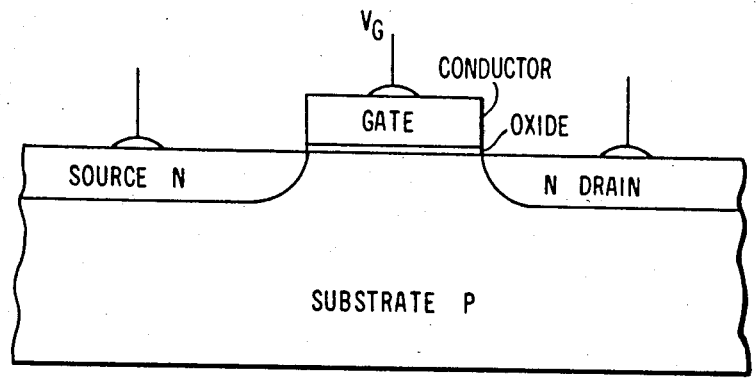
FIG. 1 is a side sectional view showing the conventional MOSFET device known to the prior art.
Figure 2:
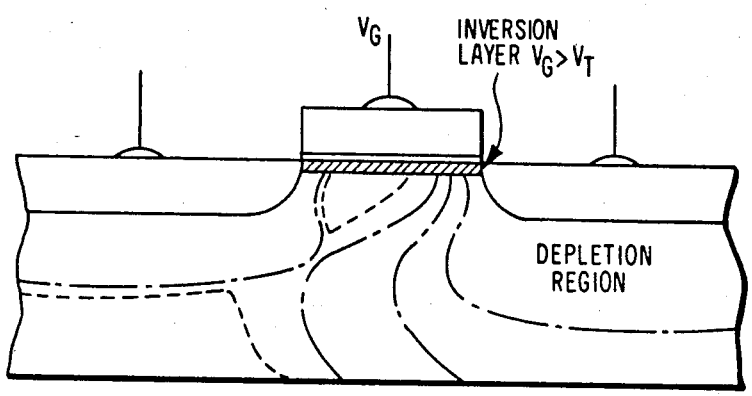
FIG. 2 is a view of the prior art device of FIG. 1 showing the inversion layer, the depletion region and the punch-through effect.
Figure 3:
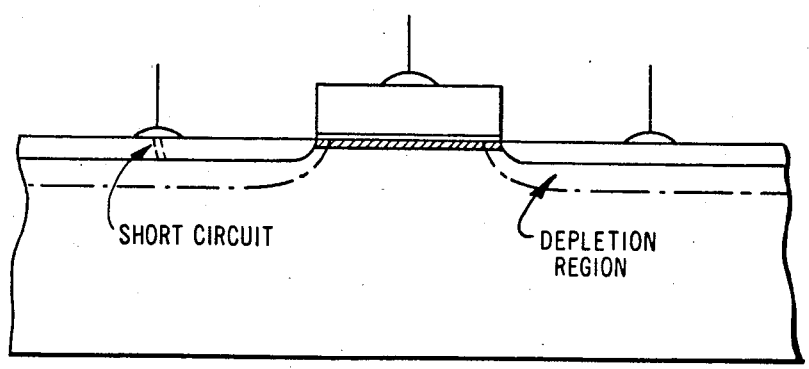
FIG. 3 is a side sectional view of a prior art shallow diffusion MOSFET device.
Figure 4:
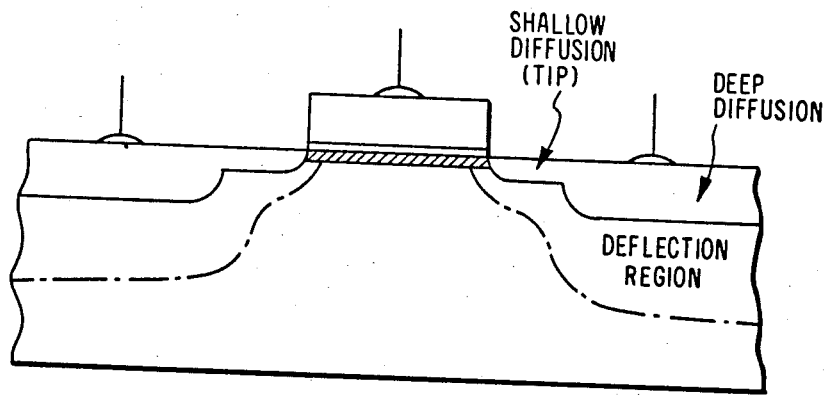
FIG. 4 is a side sectional view of a prior art tip implant MOSFET device.
Figure 5:
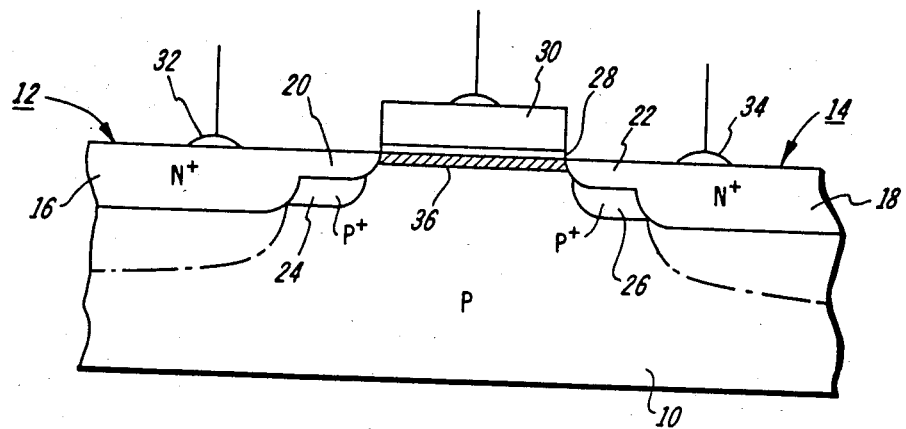
FIG. 5 is a side sectional view of the novel enhancement mode MOSFET device of the present invention.

The embodiment of this invention as illustrated in FIG. 5 represents an enhancement mode type of device which is normally "OFF". It comprises a bulk substrate 10 of p-type monocrystalline silicon having a low dopant concentration of approximately $10^{15}$ cm$^{-3}$. Two N+ type diffused junctions 12 and 14, disposed in the substrate 10, act as the source and drain, respectively. Each diffused junction 12 and 14 includes a deep diffusion region 16 and 18 extending to a depth of approximately 0.7 $\mu$m and a shallow diffusion region, or tip, 20 and 22 extending to a depth considerably less than 0.7 $\mu$m. The dopant concentration of each of these regions is selected to obtain the desired beneficial results and to minimize the deleterious results, as described above. Thus, deep diffused regions 16 and 18 are optimized to have high conductivity for interconnect and contacting and may be doped with an appropriate material, such as arsenic or phosphorous, to a surface doping density of approximately $10^{12}$ cm$^{-3}$. Similarly, the shallow diffused regions 20 and 22 are optimized for extreme shallowness and may be doped with a suitable material, such as arsenic, to a surface doping density of approximately $10^{16}$ cm$^{-3}$. A channel, having a length which may be s short as 0.5 $\mu$m, extends between the facing surfces of tips 20 and 22. Two relatively heavily doped P+ plugs or stoppers 24 and 26 are diffused beneath the tips 20 and 22. The plugs may be suitably doped with boron to a doping concentration of approximately $10^{17}$ cm$^{-3}$. A thin dielectric layer 28, of silicon dioxide or other suitable insulating material, having a thickness of about 0.03 $\mu$m is provided on the surface of the substrate extending from the tip regions 20 and 22 of source 12 and drain 14. A conductive layer 30 of suitable interconnect material, such as heavily doped polysilicon or aluminum, is provided over the dielectric layer 28, to a thickness of about 5 $\mu$m. Ohmic contacts represented by leads 32 and 34 to the source 12 and drain 14, respectively, overlie the deep diffusion zones 16 and 18.

Figure 6:
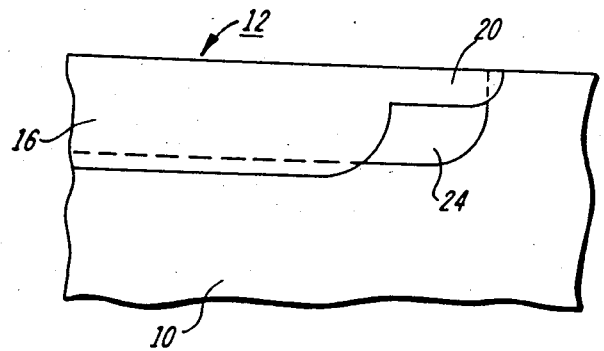
FIG. 6 is an enlarged sectional view of the plug diffusion of FIG. 5.

It is suggested that the method taught by Jecmen in U.S. Pat. No. 4,198,250 or a similar method may be utilized advantageously to form the source and drain, as illustrated herein, including a deep diffusion portion and a shallow diffusion portion. The plugs 24 and 26 may then be formed by an implant doping of the suitably selected dopant in a region substantially coextensive with the source and drain, as illustrated in FIG. 6. It is important that the net effect of the plug implant doping causes the deep junction 16 and tip 20 to remain N+, while the plug is made P+. Two factors are important in positioning the plugs during device fabrication. First, the facing portions of the tips 20 and 22 must remain unblocked in order to allow the inversion layer 36 to be formed directly below the gate 30 and second, the depth of diffusion of the plugs must be slightly shallower than the deep diffusion regions 16 and 18. If the plug diffusions were made deeper than the source and drain deep diffusion regions, the overall device junction capacitance at the interfce between these N+ doped regions 16 and 18 and the heavily doped P+ plugs would increase to an unacceptable level.

In operation, this novel device allows for shorter channel lengths than have heretofore been reliably achievable in this type of logic device. The improved configuration independently combats the problem of punch-through without substantially increasing the overall device junction capacitance, as has been the case with selectively doped known prior art devices.

If desired, the tips may be more heavily doped to further fight punch-through. Of course, as has been described, such doping will have the effect of raising the junction capacitance at the tip-plug interface. However, as the tips represent such a small portion of the overall device area, notwithstanding that the junction capacitance will be high in this limited region, its effect on the operation of the device will be negligible. Simultaneously, the deep diffusion areas 16 and 18 may interface with the lightly doped substrate, thus substantially decreasing the junction capacitance in this major area portion of the device. Although this arrangement will enhance the growth of depletion regions, the plugs will act as a shield against the growth of the depletion regions from those portions of the deep diffusion areas facing one another. Thus, as will be observed, in FIG. 5, the depletion region (represented by the phantom lines) will be confined to grow only below the deep diffusion areas, where it will have no effect on punch-through.

Figure 7:
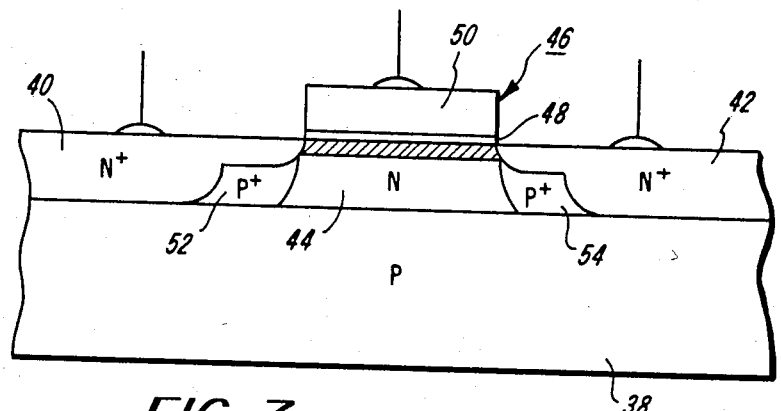
FIG. 7 is a side sectional view of the novel depletion mode MOSFET device of the present invention.

Another embodiment of the instant invention is shown in FIG. 7. This represents a depletion mode type of device which is normally "ON", i.e., current normally flows between the source and drain when the gate voltage is below threshold. The application of sufficient gate voltage, of the proper polarity, will pinch off current flow. The device comprises a p-type substrate 38 in which N+ source and drain diffusions 40 and 42, respectively, each including shallow and deep areas, are formed. An n-type doped channel region 44 spans the region between source and drain underlying a gate 46, comprised of an oxide layer or other insulating layer 48 and a conductive layer 50 overlying the substrate 38. Heavily doped P+ plugs 52 and 54, similar to those disclosed in the embodiment of FIGS. 5 and 6, underlie the shallow diffusion areas of source and drain and extend down to the substrate 38.

In operation, when the gate 46 carries a switching potential, an inversion layer indicated by the cross-hatching is formed as the n-type area 44 thereunder is converted to p-type and conduction is shut off. In the absence of the plugs 52 and 54, pinch-off current control is inherently slow and generally requires higher gate voltages. The reason therefor is readily apparent; a large volume of semiconductor material is required to be converted (the entire area 44). The present invention, in this mode, will dramatically increase the speed of operation of this device for two reasons. First, it is only necessary to deplete or convert a very shallow region under the gate to pinch off current flow and second, the short channel between source and drain may be further diminished because the plugs will eliminate the depletion region and subsequent punch-through which would be formed after pinch-off in the previously known devices of this type.

Figure 8:
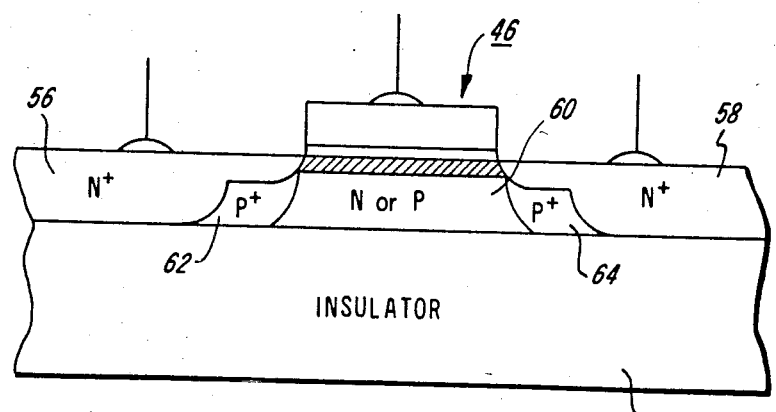
FIG. 8 is a side sectional view of an alternative embodiment of the novel MOSFET device of the present invention wherein the active elements are disposed upon an insulating substrate.

Yet another embodiment of the present invention is illustrated in FIG. 8. It differs from the previously described embodiments of this invention in that the source 56, the drain 58, the channel region 60 and the plugs 62 and 64 are disposed upon an insulator 66. This device may be either of the enhancement mode or depletion mode, depending on whether a p-type or n-type dopant is used in the channel region 60. It should be apparent that this structure is fully optimized to prevent punch-through and to eliminate junction capacitance beneath the deep diffusion portion of the source and drain.

It should be understood that the present disclosure has been made by way of example and that numerous changes in details of construction may be resorted to without departing from the spirit of the invention as hereinafter claimed.

What is claimed is:

1. An improved short channel field effect transistor characterized by including
    a semiconductor substrate of a first conductivity type,
    a source region of a second conductivity type, opposite said first conductivity type and having an impurity concentration higher than that of said substrate, disposed in a first surface portion of said substrate and comprising a relatively shallow diffused tip portion laterally offset from and contiguous with a relatively deep diffused portion,
    a drain region of said second conductivity type and having an impurity concentration higher than that of said substrate, disposed in a second surface portion of said substrate and comprising a relatively shallow diffused tip portion laterally offset from and contiguous with a relatively deep diffused portion, wherein said drain shallow diffused tip portion faces said source shallow diffused tip portion,
    a channel region, of either said first conductivity type or said second conductivity type, disposed in a third surface portion of said substrate separating said source region from said drain region,
    a gate insulation film located on the surface of said substrate between said source and drain regions, said gate insulation film overlying said channel region,
    a gate electrode located upon said gate insulation film,
    a source contact upon the upper surface of said source region,
    a drain contact upon the upper surface of said drain region, and
    plug regions, of said first conductivity type each having an impurity concentration higher than that of said substrate, and each associated with and contiguous to each source and drain region, each of said plug regions being located beneath each of said shallow diffused tip portions and between said deep diffused portions and said channel region, said plug regions being separated by said channel region by a distance no less than the shortest distance between said source and drain shallow diffused portions and said plug regions being no deeper than the greatest depth of said source and drain deep diffused portions.

2. The improved short channel field effect transistor as defined in claim 1 characterized in that said plug regions are position so that the facing parts of said shallow diffused portions are not blocked thereby and said plug regions are slightly shallower than said deep diffused portions.

3. The improved short channel field effect transistor as defined in claim 1 characterized in that said source and drain electrodes overlie said deep diffused portions.

4. The improved short channel field effect transistor as defined in claim 1 characterized in that said channel region has an impurity concentration approximately the same as said substrate.

5. An improved short channel field effect transistor characterized by including
    a substrate comprising an insulating material,
    a semiconductor layer disposed over said insulating material,
    a source region of a first conductivity type in said semiconductor layer, comprising a relatively shallow diffused tip portion laterally offset from and contiguous with a relatively deep diffused portion, said relatively deep diffused portion being contiguous with said substrate,
    a drain region of said first conductivity type in said semiconductor layer, comprising a relatively shallow diffused tip portion laterally offset from and contiguous with a relatively deep diffused portion, said relatively deep diffused portion being contiguous with said substrate and wherein said drain shallow diffused tip portion faces said source shallow diffused tip portion,
    a channel region of either said first conductivity type or a second conductivity type, opposite said first conductivity type, comprising the portion of said semiconductor layer, disposed between said source and drain regions, a gate insulating film located on the surface of said channel region between said source and drain regions, a gate electrode located upon said gate insulation film, a source contact located upon the upper surface of said source region, a drain contact located upon the upper surface of said drain region, and plug regions of said second conductivity type associated with and contiguous to each source and drain region and located upon said insulating substrate, beneath each of said shallow diffused tip portions, between said deep diffused portions and said channel region, said plug regions being separated by said channel region and being separated by a distance no less than the shortest distance between said source and drain shallow diffused portions.

* * * * *